US009607715B1

(12) United States Patent
Botea (10) Patent No.: US 9,607,715 B1
(45) Date of Patent: Mar. 28, 2017

(54) MEMORY INTERNAL COMPARATOR TESTING SYSTEM

(71) Applicant: Apple Inc., Cupertino, CA (US)

(72) Inventor: Dragos F. Botea, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/172,768

(22) Filed: Jun. 3, 2016

(51) Int. Cl.
*G11C 7/00* (2006.01)
*G11C 29/08* (2006.01)
*G11C 7/10* (2006.01)
*G11C 29/50* (2006.01)

(52) U.S. Cl.
CPC .............. *G11C 29/08* (2013.01); *G11C 7/10* (2013.01); *G11C 29/50* (2013.01)

(58) Field of Classification Search
CPC ......... G11C 29/56; G11C 29/50; G11C 29/48; G11C 29/08
USPC ................ 365/201, 189.07, 230.03, 189.14
See application file for complete search history.

(56) References Cited

U.S. PATENT DOCUMENTS

| 4,541,094 A | 9/1985 | Stiffler et al. |
|---|---|---|
| 4,849,979 A | 7/1989 | Maccianti et al. |
| 5,276,690 A | 1/1994 | Lee et al. |
| 6,757,857 B2 | 6/2004 | Lamb et al. |
| 8,004,915 B1 * | 8/2011 | Dastidar ................ G11C 29/12 365/201 |
| 8,032,803 B2 | 10/2011 | Anzou et al. |
| 2016/0086678 A1 | 3/2016 | Botea et al. |

* cited by examiner

*Primary Examiner* — David Lam
(74) *Attorney, Agent, or Firm* — Meyertons, Hood, Kivlin, Kowert & Goetzel, P.C.

(57) ABSTRACT

In some embodiments, a system includes a memory testing circuit configured to perform a test of an internal comparator of a memory circuit by performing operations. The operations may include causing a first value to be stored at the memory circuit as a current data value. The operations may further include subsequently causing the first value to be sent to the memory circuit as a current comparison data value. The operations may further include causing the internal comparator to compare the current data value to the current comparison data value. The operations may further include receiving a current match value that indicates whether the current data value matches the current comparison data value. In some embodiments, the memory testing circuit may be configured to enable a self-test circuit to detect errors regarding functions of the memory circuit that the self-test circuit is not designed to test.

20 Claims, 5 Drawing Sheets

MEMORY INTERNAL COMPARATOR TESTING SYSTEM

BACKGROUND

Technical Field

This disclosure relates generally to a memory internal comparator testing system.

Description of the Related Art

Memory devices typically store large amounts of data and are able to retrieve the data upon request. As modern memory devices include more storage and are expected to return data at a faster and faster rate, designs for the memory devices become more complex. Complex memory devices may be difficult to fabricate correctly. Additionally, complex memory devices may be more prone to failure during operation. Thus, memory devices may operate incorrectly.

A memory device may be tested (e.g., by a manufacturer) to determine whether the memory device correctly stores and retrieves data. One mechanism that may be used to test the memory device is a hardware testing device, such as a built in self-test (BIST). A BIST may enable the memory device to perform tests on itself to verify some or all of the internal functionality of the memory device. Some companies provide commercial BIST designs. Commercial BIST designs may be able to verify a set of functions of the memory device.

SUMMARY

In various embodiments, an integrated circuit is disclosed that includes a memory, a self-test circuit (e.g., a built in self-test (BIST) unit), and a memory testing circuit. The self-test circuit may be standardized and thus may not be designed to test the functions of the memory. In other words, where the memory has specialized functionality or properties the self-test circuit may be unable to test the specialized functionality or properties. For example, the self-test circuit may not be designed to test additional hardware of the memory, such as an internal comparator. The memory testing circuit may cause the integrated circuit to test features (e.g., the internal comparator) of the memory that the self-test circuit is not designed to test.

For example, in one embodiment, the memory testing circuit receives a write request from the self-test circuit, where the write request indicates a comparison operation at the memory (e.g., via one or more control flags provided by the write request). The memory testing circuit may send a first value from the write request to the memory such that the memory stores the first value as a current data value. In some embodiments, the first value includes the one or more control flags. In other embodiments, the one or more control flags are sent separately. The memory testing circuit may subsequently send the first value to the memory as a current comparison data value for the memory. The memory testing circuit may cause the internal comparator of the memory to compare the current data value to the current comparison data value. For example, in some embodiments, the internal comparator may be configured to compare a value from an input of the memory to a data value in response to the one or more control flags indicating a comparison operation and in response to a read request that addresses the value. Accordingly, the memory testing circuit may send a read request (e.g., received from the self-test circuit) to the memory that addresses the current data value. The memory testing circuit may receive a current match value in response to causing the internal comparator of the memory to compare the current data value to the current comparison data value. Additionally, in some embodiments, the memory testing circuit may receive an output value (e.g., in response to a read request). In response to the current match value indicating the current data value does not match the current comparison data value, the memory testing circuit may modify the output value in a specified manner that indicates a comparison failure (e.g., inverting the output value). As a result, even though the self-test circuit may be unable test the internal comparator (and thus may not receive the current match value), because the output value is modified in the specified manner, the self-test circuit may report an error that can be traced back to a comparison failure. Thus, the memory testing circuit may be used to test features of the memory, which may correspond to features the self-test circuit is not designed to test.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks duting operation. A structure can be said to be "configured to" perform some task even if the structure is not currently being operated. A "memory testing circuit configured to send a write request" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a memory testing circuit that includes eight data modification circuits, portions, the terms "first data modification circuit" and "second data modification circuit" can be used to refer to any two of the eight data modification circuits, and not, for example, just logical data modification circuits 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

As described above, a commercial built in self-test (BIST) design may be able to test a set of features and functions of a memory device. However, the commercial BIST design may be unable to test other features and functions (e.g., whether an internal comparator correctly identifies whether two data values match) of the memory device. Designing a custom BIST to test these other features and functions may be undesirably expensive. As will be discussed below, a memory testing circuit may be used to test at least some of the other features and functions.

A memory internal comparator testing system is described herein where a memory testing circuit performs a test of a memory circuit that includes an internal comparator. (As used herein, the reference to the comparator being "internal" simply means that the comparator is within the device being tested—the memory circuit—and not, for example, the memory testing circuit.) This disclosure contemplates that the comparator could be in various locations within the memory circuit (e.g., associated with a particular bit cell or a group of bit cells, etc.).

The internal comparator may compare a current data value stored in the memory with a current comparison data value (e.g., provided to the memory or also stored in the memory) to produce a current match value. The memory testing circuit may request various operations at the memory to trigger the comparison between the current data value and the current comparison data value. In some embodiments, the memory testing circuit may modify an output value received from the memory based on the current match value to indicate whether the current match value indicates a comparison failure.

As used herein, a "comparison failure" refers to an internal comparator corresponding to a memory location determining that a current data value of the memory location does not match (i.e., at least one bit differs with respect to) a current comparison data value for the memory location. For example, a comparison failure may occur if the internal comparator detects one bit differing between the current data value and the current comparison data value. A comparison failure may also occur if the internal comparator detects more than one bit differing between the current data value and the current comparison data value.

The present disclosure references a "portion of memory" and a "different portion of memory." As used herein, the term "different" means that the two memory portions cannot completely overlap each other. Thus, it must be the case that at least some of the memory locations in the "portion" are not in the "different portion," vice versa, or both. The portion and the different portion also may not overlap at all.

As used herein, a memory operation being performed "correctly" refers to the operations being performed according to design specifics for the memory. For example, a system may determine that a write operation followed by a read operation that address a single memory were performed correctly by determining that the read operation returns the data written by the write operation.

Figure 1:
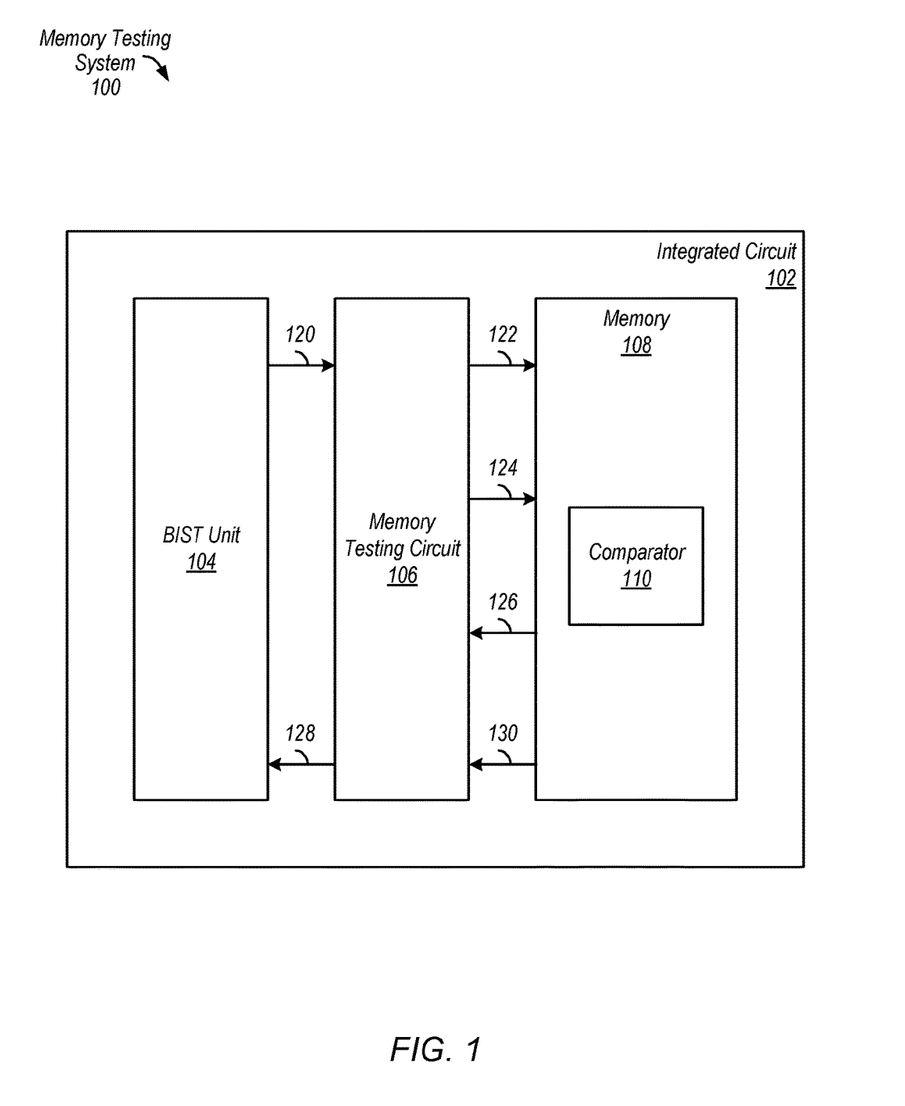
FIG. 1 is a block diagram illustrating one embodiment of an exemplary memory internal comparator testing system.

This disclosure initially describes, with reference to FIG. 1, various portions of various embodiments of a memory testing system. Example processes performed by various embodiments of a memory testing system are described with reference to FIGS. 2 and 3. A method performed by an embodiment of a memory testing circuit is described with reference to FIG. 4. Finally, an exemplary computing system that includes at least a portion of an exemplary memory internal comparator testing system is described with reference to FIG. 5.

Turning now to FIG. 1, a block diagram of various embodiments of an exemplary memory testing system 100 is shown. In the illustrated embodiment, memory testing system 100 includes integrated circuit 102. Additionally, in some embodiments, integrated circuit 102 includes built-in self-test (BIST) unit 104, memory testing circuit 106, and memory 108. In the illustrated embodiment, memory 108 includes comparator 110. In other embodiments, one or more portions of the memory testing system 100 are not included (e.g., BIST unit 104).

Figure 3:
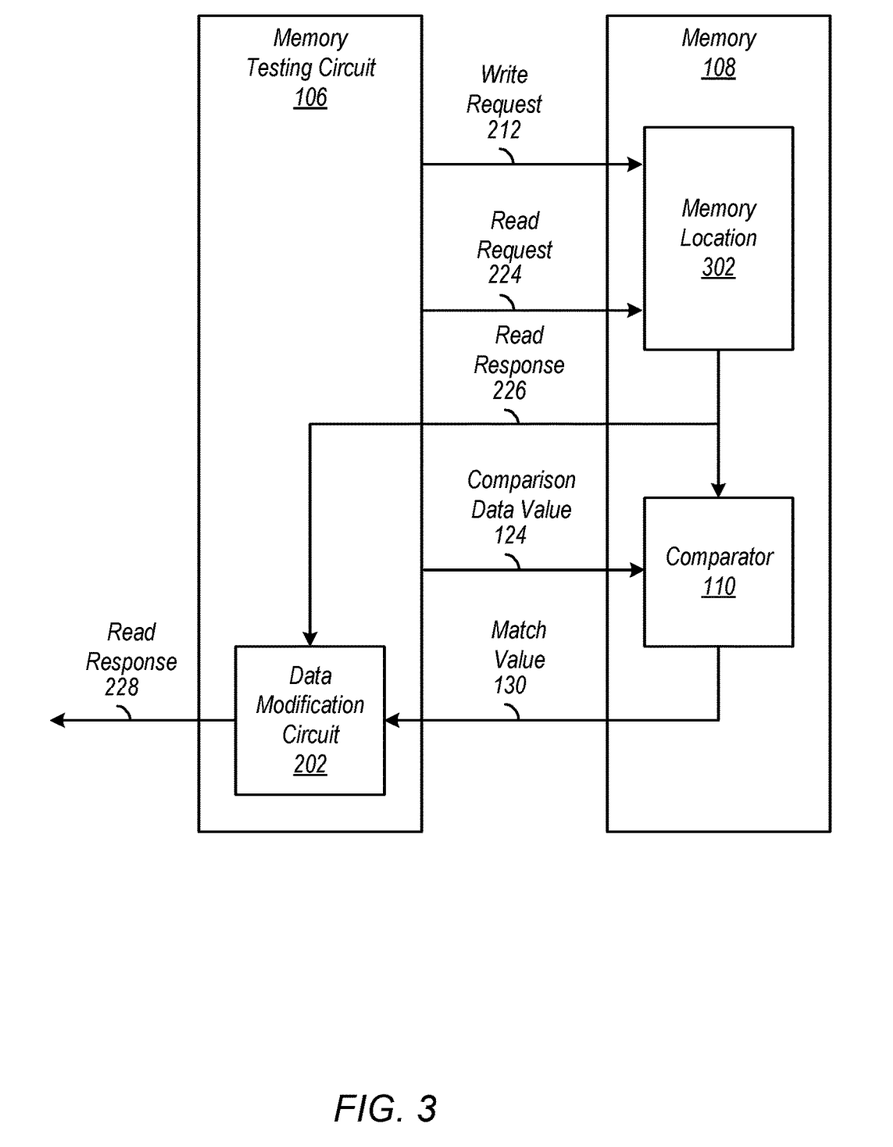
FIG. 3 is a block diagram illustrating an exemplary memory internal comparator test performed by one embodiment of an exemplary internal comparator testing system.

In various embodiments, memory 108 may send one or more data values to comparator 110 for comparison. For example, in some embodiments, memory 108 may store one or more control flags as part of a data value. When the data value is read, memory 108 may identify the one or more control flags and, based on the one or more control flags, send the data value to comparator 110 to be compared to another value. Alternatively, memory 108 may use another trigger to determine that a value should be compared (e.g., one or more signals received with a read instruction). As further described below with reference to FIG. 3, comparator 110 (e.g., an internal comparator of memory 108) may be configured to compare two data values and indicate whether the two data values match. In some embodiments, one of the data values, a current data value, is stored at memory 108 and is compared to a data value received at memory 108 (e.g., via one or more input ports), a comparison data value. In other embodiments, both the current data value and the comparison data value are stored at memory 108. For example, the comparison data value may be sent with the current data value or the current data value may be written into multiple locations, where one of the multiple locations is used to provide the comparison data value (the current data value written to that location). The current data value and the comparison data value may be received at memory 108 at the same time or at different times. In the illustrated embodiment, in response to a read request (e.g., one of memory request(s) 122) addressing a memory location that stores a data value having control flags that indicate a comparison, memory 108 may output the data value and may further send the data value to comparator 110 to be compared to comparison data value 124 received at memory 108. Comparator 110 may output match value 130, indicating whether comparison data value 124 matches the data value. In various embodiments, performing the comparison at memory 108 may be faster, as compared a system where a data value is output from a memory to an external comparator.

BIST unit 104 (e.g., a self-test circuit) may request various memory operations from memory 108 as part of a testing process. BIST unit may send various memory request(s) 120 to memory 108 (e.g., via memory testing circuit 106) and may receive various memory response(s) 128 from memory 108 (e.g., again via memory testing circuit 106) in response to memory request(s) 120. In some embodiments, as discussed below with reference to FIGS. 2 and 3, memory request(s) 120 may include one or more control flags that indicate a comparison operation should be performed. In some cases, one or more of memory request(s) 120 may cause the comparison operation to be performed (e.g., by comparator 110). However, in some embodiments, BIST unit 104 has limited functionality by design (e.g., BIST unit 104 is a generic, mass-produced self-test tool designed to test many types of memory devices) and is unable to test comparator 110. Other self-test tools may also be used in conjunction with the illustrated devices. For example, in some embodiments, memory testing system 100 further includes automated test equipment (ATE) configured to provide one or more testing instructions to BIST unit 104, memory testing circuit 106, memory 108, or any combination thereof.

As further described below with reference to FIGS. 2 and 3, memory testing circuit 106 may perform a test of comparator 110. In particular, memory testing circuit 106 may send memory request(s) 122 and comparison data value 124 to memory 108 and may receive memory response(s) 126 and match value 130 from memory 108. In some cases, memory testing circuit 106 may perform the test in response to detecting one or more control flags in one or more memory requests from BIST unit 104 (e.g., one or more of memory request(s) 120). In some cases, comparison data value 124 may match a data value provided to memory 108 as part of memory request(s) 122 (e.g., so comparator 110 is expected to detect a match). In other cases, comparison data value 124 may not match the data value (e.g., so comparator 110 is expected to detect no match). In some embodiments, as discussed further below, memory testing circuit 106 may modify the data received in response to memory request(s) 122 of the test in a specified manner (e.g., specified by hard coding memory testing circuit 106 or via an ATE). The specified manner may correspond to unusual test results that may indicate, to a user that is testing memory 108, that a comparison failure may have occurred (as opposed to the unusual test results). For example, the specified manner may be inverting all bits of the data received in response to memory request(s) 122, indicating a large number of read failures (e.g., a read failure for every bit in the addressed memory location). Accordingly, memory testing circuit 106 may be used to test additional functions (e.g., comparator 110) of memory 108 that BIST unit 104 may be unable to test.

Figure 2:
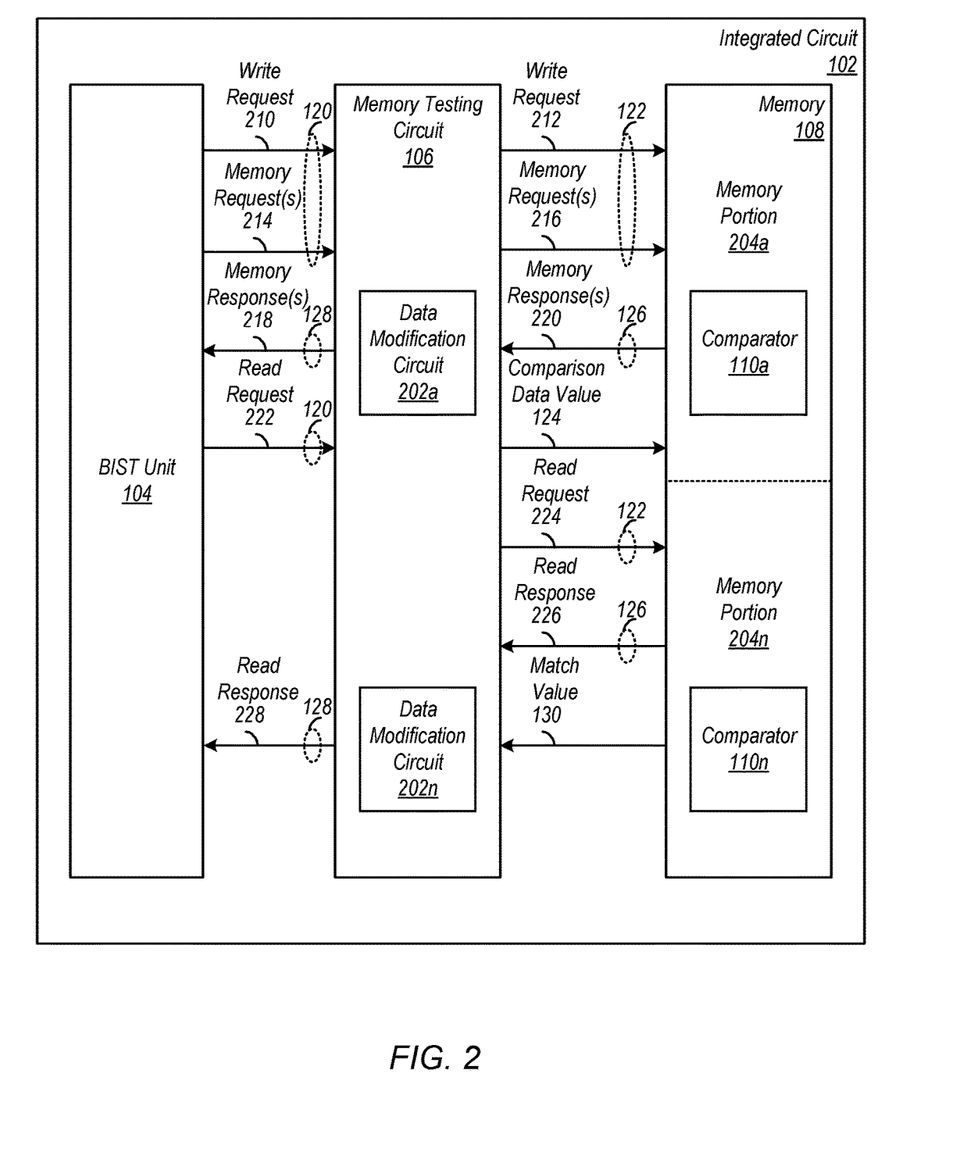
FIG. 2 is a block diagram illustrating an exemplary memory internal comparator test performed by one embodiment of an exemplary internal comparator testing system.

Turning now to FIG. 2, a block diagram illustrating components of memory testing system 100 performing an exemplary memory internal comparator test are shown. In the illustrated embodiment, memory testing circuit 106 includes data modification circuits 202a and 202n. In the illustrated embodiment, memory 108 includes two portions: memory portions 204a and 204n. Memory portion 204a includes comparator 110a. Memory portion 204n includes comparator 110n. However, in other embodiments, memory testing circuit 106 may include more than two data modification circuits. Similarly, in other embodiments, memory 108 may include more than two memory portions, more than two comparators, or both. In some embodiments, some memory portions may not include corresponding comparators (e.g., because those portions use comparators from other portions).

In the illustrated embodiment, a comparison is triggered when a read request is received by a memory portion and the data stored at the location addressed by read request includes a control flag that indicates a comparison. However, as discussed above, in other embodiments, other memory operations may be performed as part of the memory internal comparator test and the comparison may be triggered in other ways.

As described above, in some embodiments, BIST unit 104 may request memory operations from memory 108 as part of a testing process. In the illustrated embodiment, BIST unit 104 sends write request 210 to memory testing circuit 106, addressing a portion of memory 108 (e.g., memory portion 204*a*). Write request 210 may request that a first value be stored as a current data value in the portion of memory 108. Write request 210 may include one or more control flags that indicate a comparison operation should be performed. In some embodiments, the one or more control flags may be part of the current data value. In other embodiments, the one or more control flags may be separate from the current data value. Memory testing circuit 106 may forward write request 210 to memory 108 as write request 212. The one or more control flags may be sent to memory 108 and stored as part of write request 212. Additionally, memory testing circuit 106 may store an address associated with write request 210 and a data value indicated by write request 210.

After write request 212 is sent to memory 108, in some embodiments, BIST unit 104 may send various memory request(s) 214 to memory testing circuit 106 (e.g., as part of one or more other tests), addressing one or more various addresses in memory 108 (e.g., memory portion 204*n*). Memory testing circuit 106 may forward memory request(s) 214 to memory 108 as memory request(s) 216. In response to memory request(s) 216, memory testing circuit 106 may receive memory response(s) 220 from memory 108. Memory testing circuit 106 may forward memory response(s) 220 to BIST unit 104 as memory response(s) 218. In other embodiments, BIST unit 104 does not send memory requests between write request 210 and read request 222.

Subsequent to sending write request 210 to memory testing circuit 106, BIST unit 104 may send read request 222 to memory testing circuit 106, requesting the current data value written in response to write request 210. Memory testing circuit 106 may identify that the address in read request 222 matches the address from write request 210 and may send comparison data value 124 to memory 108. Additionally, as further described below with respect to FIG. 3, memory testing circuit 106 may forward read request 222 to memory 108 as read request 224. In some embodiments, comparison data value 124 and read request 224 may be sent during a same clock cycle. In other embodiments, read request 224 may be sent during an earlier clock cycle than comparison data value 124 or comparison data value 124 may be sent during an earlier clock cycle than read request 224. In response to read request 224, the addressed memory portion (e.g., memory portion 204*a*) may send the data value stored at the addressed location (e.g., the current data value) to a corresponding comparator (e.g., comparator 110*a*) and may output the data value as read response 226. The corresponding comparator may compare the current data value to comparison data value 124 and output whether the two values match as match value 130. Accordingly, in some embodiments, the comparator may detect one or more errors associated with memory 108 storing a data value. In some cases, an unexpected indication regarding a match (e.g., an indication of no match when a match is expected or vice versa) may indicate the comparator suffered an error.

As further described below with respect to FIG. 3, memory testing circuit 106 may indicate whether the comparator indicated a match. In some embodiments, memory testing circuit 106 may indicate whether an unexpected indication regarding a match was detected. As discussed above, in some embodiments, BIST unit 104 may be a commercial BIST unit and thus may not be configured to receive a separate signal regarding a match. Memory testing circuit 106, via a corresponding data modification circuit (e.g., data modification circuit 202*a*) may modify read response 226 in a specified manner and send the modified data value to BIST unit 104 as read response 228. The modified data value may be recognized by BIST unit 104 as a particular error, which a user reading an output from BIST unit 104 may recognize as likely corresponding to a comparison failure. Accordingly, memory testing circuit 106 may use BIST unit 104 to report an error. In various embodiments, data modification circuits 202*a* and 202*n* correspond to respective memory portions 204*a* and 204*n*. However, in other embodiments, memory portions 204*a* and 204*n* correspond to a single data modification circuit. Alternatively, a single data modification circuit may correspond to a subset of a memory portion.

Although particular components are illustrated with respect to FIG. 2, in other embodiments, additional components may be included (e.g., an ATE) or various components may be omitted. For example, in some cases, BIST unit 104 may be omitted and memory testing circuit 106 may output one or more test results to one or more other devices. Additionally, memory testing circuit 106 may be configured to generate write request 212, comparison data value 124, and read request 224 without receiving write request 210 or read request 222. Additionally, other configurations of the components of FIG. 2 may be used. For example, memory testing circuit 106 may not forward communications between BIST unit 104 and memory 108. Instead, memory testing circuit 106 may separately communicate with memory 108 (e.g., using one or more multiplexers). Additionally, although the communications are described herein as being in a particular order, in other embodiments, various communications may be sent in a different order. For example, read response 228 may be sent prior to memory response(s) 218.

Turning now to FIG. 3, an exemplary memory internal comparator test performed by one embodiment of an exemplary internal comparator testing system is shown. FIG. 3 illustrates additional details regarding the memory internal comparator test described above with respect to FIG. 2. In FIG. 3, memory 108 additionally includes memory location 302.

As discussed above, memory testing circuit 106 may forward write request 210 to memory 108 as write request 212. In the illustrated embodiment, data from write request 212 may be stored at memory location 302 as the current data value. Additionally, one or more control flags that indicate a comparison operation should be performed are stored at memory location 302. Subsequently, in response to read request 224, memory 108 may identify, based on the one or more control flags, that the comparison operation should be performed. Accordingly, the current data value is forwarded from memory location 302 to comparator 110 and is further output to memory testing circuit 106 as read response 226. In some embodiments, the current data value is all data stored at memory location 302. In other embodiments, the current data value is a subset of the data stored at memory location 302. Comparator 110 may compare the current data value with comparison data value 124 and may generate match value 130, which may indicate whether the current data value matches comparison data value 124. Match value 130 may be sent to data modification circuit 202, which may modify the current data value from read response 226 based on match value 130. For example, in response to receiving an indication of no match, data modification circuit 202 may invert the current data value and output the inverted current data value as part of read response 228. As another example, in response to receiving an indication of a match, data modification circuit 202 may output the current data value as part of read response 228. Alternatively, data modification circuit 202 may modify the current data value in response to match value 130 not matching an expected match value (e.g., in response to receiving an indication of a match when no match is expected). In some embodiments, data modification circuit 202 may modify read response 226 differently when an indication of a match is received and no match is expected, as compared to when an indication of no match is received and a match is expected. Accordingly, memory testing circuit 106 may indicate to a self-test circuit whether the match value indicated that the current data value matched comparison data value 124 even if the self-test circuit isn't able to test the comparator 110.

Figure 4:
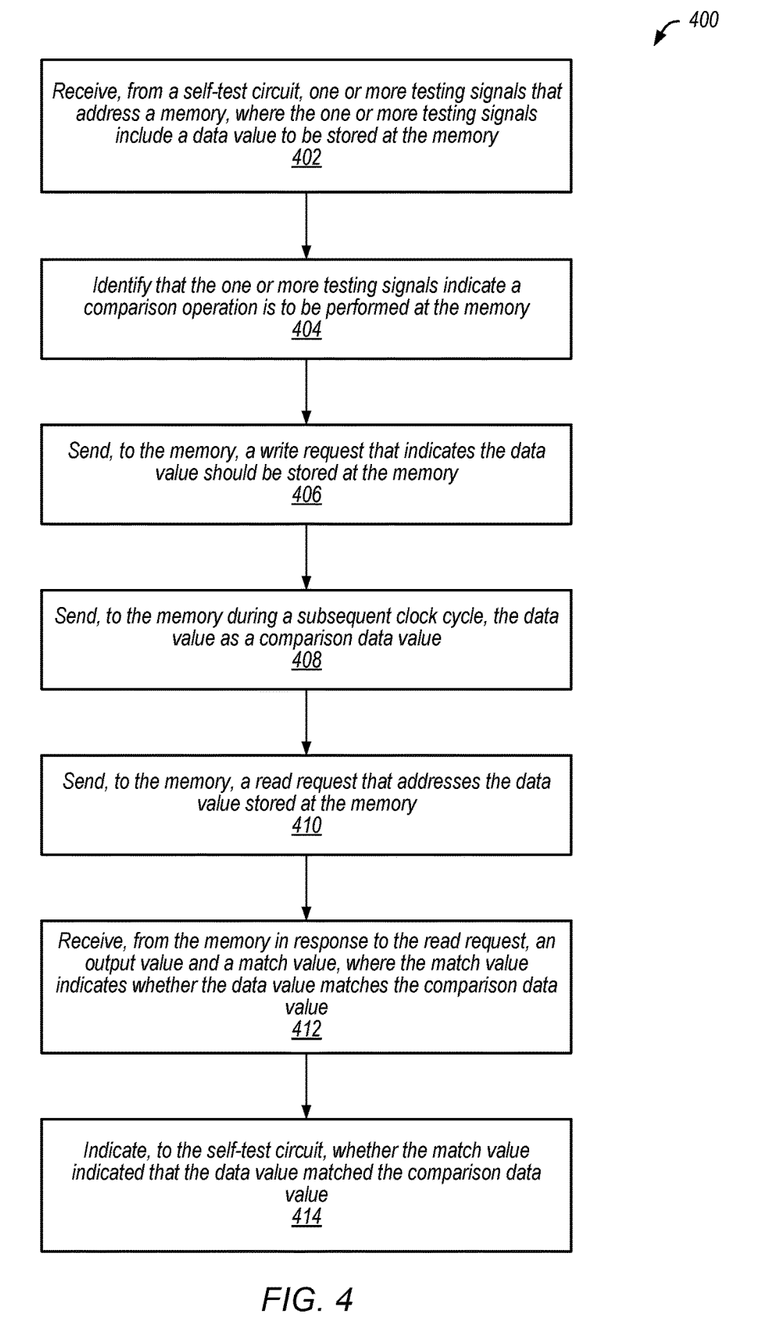
FIG. 4 is a flow diagram illustrating one embodiment of a method of performing a memory internal comparator test.

Referring now to FIG. 4, a flow diagram of a method 400 is depicted. Method 400 is an embodiment of a method of performing a memory internal comparator test. In some embodiments, method 400 may be initiated or performed by one or more processors in response to one or more instructions stored by a computer-readable storage medium.

At 402, method 400 includes receiving, from a self-test circuit, one or more testing signals that address a memory, where the one or more testing signals include a data value to be stored at the memory. For example, method 400 may include memory testing circuit 106 of FIG. 2 receiving, from BIST unit 104, write request 210 that addresses memory 108. Write request 210 may include a data value to be stored at memory 108.

At 404, method 400 includes identifying that the one or more testing signals indicate a comparison operation is to be performed at the memory. For example, method 400 may include memory testing circuit 106 identifying that write request 210 indicates, via one or more control flags, that a comparison operation is to be performed at memory 108.

At 406, method 400 includes sending, to the memory, a write request that indicates the data value should be stored at the memory. For example, method 400 may include memory testing circuit 106 sending write request 212 to memory 108.

At 408, method 400 includes sending, to the memory during a subsequent clock cycle, the data value as a comparison data value. For example, method 400 may include memory testing circuit 106 sending comparison data value 124 to memory 108 during a clock cycle subsequent to a clock cycle during which write request 212 was sent.

At 410, method 400 includes sending, to the memory, a read request that addresses the data value stored at the memory. For example, method 400 may include memory testing circuit 106 sending read request 224 to memory 108 addressing the data value written by write request 212.

At 412, method 400 includes receiving, from the memory in response to the read request, an output value and a match value, where the match value indicates whether the data value matches the comparison data value. For example, in response to read request 224, memory testing circuit 106 may receive read response 226 and match value 130.

At 414, method 400 includes indicating, to the self-test circuit, whether the match value indicated that the data value matched the comparison data value. For example, based on whether match value 130 indicated a match, memory testing circuit 106 may, in some cases, modify the data value from read response 226 in a specified manner. The resulting data value may be sent to BIST unit 104 as part of read response 228. Accordingly, a method of performing a memory internal comparator test is depicted.

Figure 5:
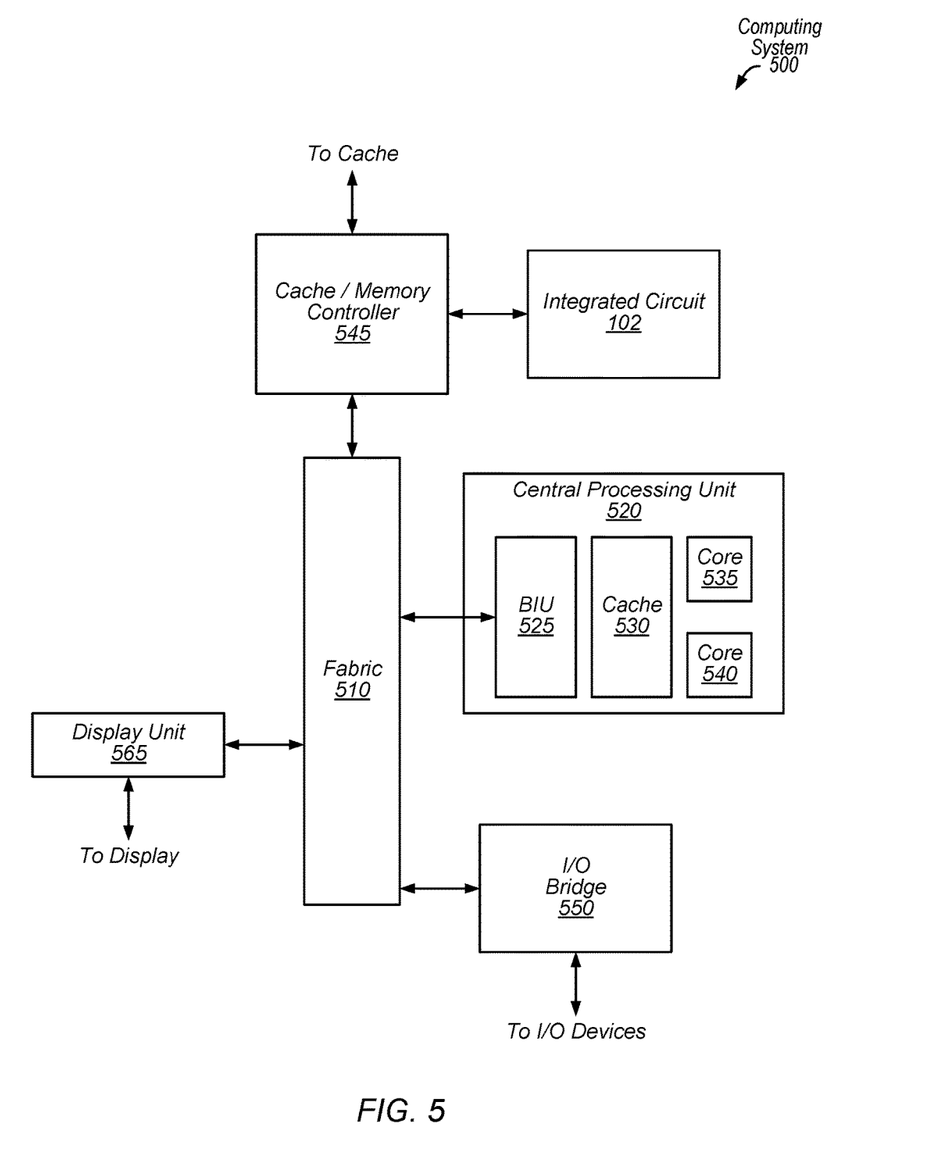
FIG. 5 is block diagram illustrating an embodiment of an exemplary computing system that includes at least a portion of an exemplary memory internal comparator testing system.

Turning next to FIG. 5, a block diagram illustrating an exemplary embodiment of a computing system 500 that includes at least a portion of an exemplary memory internal comparator testing system. Computing system 500 may include various circuits described above with reference to FIGS. 1-4. Computing system 500 may further include any variations or modifications described previously with reference to FIGS. 1-4. In some embodiments, some or all elements of the computing system 500 may be included within a system on a chip (SoC). In some embodiments, computing system 500 is included in a mobile device. Accordingly, in at least some embodiments, area, timing, and power consumption of computing system 500 may be important design considerations. In the illustrated embodiment, computing system 500 includes fabric 510, central processing unit (CPU) 520, input/output (I/O) bridge 550, cache/memory controller 545, and display unit 565. Although the computing system 500 illustrates central processing unit 520 as being connected to fabric 510 as a sole central processing unit of the computing system 500, in other embodiments, central processing unit 520 may be connected to or included in other components of the computing system 500 and other central processing units may be present. Additionally or alternatively, the computing system 500 may include multiple central processing units 520. The multiple central processing units 520 may correspond to different embodiments or to the same embodiment.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, central processing unit 520 includes bus interface unit (BIU) 525, cache 530, and cores 535 and 540. In some embodiments, cache 530 includes some or all of integrated circuit 102, which may correspond to any of the embodiments described above with reference to FIGS. 1-4. In various embodiments, central processing unit 520 includes various numbers of cores and/or caches. For example, central processing unit 520 may include 1, 2, or 4 processor cores, or any other suitable number. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between central processing unit 520 and other elements of computing system 500. Processor cores 535 and 540 may be configured to execute instructions of a particular instruction set architecture (ISA), which may include operating system instructions and user application instructions. In some embodiments, integrated circuit 102 may be in multiple locations.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In the illustrated embodiment, cache/memory controller 545 is directly coupled to integrated circuit 102. In other embodiments, cache/memory controller 545 is directly coupled to one or more memories, such as memory 108. In some embodiments, the cache/memory controller 545 includes one or more internal caches, which may correspond to or include integrated circuit 102. In some embodiments, the cache/memory controller 545 may include or be coupled to one or more caches and/or memories that include instructions that, when executed by one or more processors, cause the processor, processors, or cores to initiate or perform some or all of the processes described above with reference to FIGS. 1-4.

As used herein, the term "coupled to" may indicate one or more connections between elements, and a coupling may include intervening elements. For example, in FIG. 5, display unit 565 may be described as "coupled to" central processing unit 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width width modulation (PWM), general-purpose input/output (GPIO), serial peripheral interface (SPI), and/or inter-integrated circuit (I2C), for example. Various types of peripherals and devices may be coupled to computing system 500 via I/O bridge 550. In some embodiments, central processing unit 520 may be coupled to computing system 500 via I/O bridge 550.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a memory circuit having an internal comparator configured to compare a current data value stored in the memory circuit with a current comparison data value to produce a current match value; and
    a memory testing circuit configured to communicate with the memory circuit to perform a test of the internal comparator by:
        causing a first value to be sent to the memory circuit such that the memory circuit stores the first value as the current data value;
        subsequently causing the first value to be sent to the memory circuit as the current comparison data value for the memory circuit;
        causing the internal comparator to compare the current data value to the current comparison data value; and
        receiving the current match value, wherein the current match value indicates whether the current data value from the memory circuit matches the current comparison data value.

2. The apparatus of claim 1, further comprising a self-test circuit configured, prior to the test, to send the first value to the memory testing circuit.

3. The apparatus of claim 2, wherein the memory testing circuit is further configured to:
    receive the current data value from the memory circuit;
    in response to the current match value indicating that the current data value does not match the current comparison data value, modify the current data value received from the memory circuit to generate a modified current data value, wherein the modified current data value indicates that the current data value does not match the current comparison data value; and
    send the modified current data value to the self-test circuit.

4. The apparatus of claim 3, wherein modifying the current data value to generate the modified current data value comprises inverting the current data value.

5. The apparatus of claim 3, wherein the current data value is modified such that the self-test circuit will identify the modified current data value as representing one or more read failures at the memory circuit.

6. The apparatus of claim 2, wherein the memory testing circuit is configured to receive one or more memory requests from the self-test circuit and to pass the one or more memory requests to the memory circuit.

7. The apparatus of claim 6, wherein the memory testing circuit is configured to receive one or more memory responses from the memory circuit in response to the one or more memory requests and to pass the one or more memory responses to the self-test circuit.

8. The apparatus of claim 1, wherein the causing the internal comparator to compare the current data value with the current comparison data value comprises sending a request for a memory operation to the memory circuit.

9. The apparatus of claim 8, wherein the request for a memory operation is a read request that addresses the current data value.

10. The apparatus of claim 1, wherein the memory testing circuit is configured to perform a second test of the internal comparator, comprising:
    causing a second value to be sent to the memory circuit such that the memory circuit stores the second value as the current data value;
    subsequently causing a third value to be sent to the memory circuit as the current comparison data value for the memory circuit, wherein the third value is different from the second value;
    causing the internal comparator to compare the current data value to the current comparison data value; and
    receiving the current match value, wherein the current match value indicates whether the current data value from the memory circuit matches the current comparison data value.

11. The apparatus of claim 1, wherein the test includes the memory testing circuit is configured to perform the test by performing the causing the first value to be sent to the memory circuit in a first clock cycle and the causing the internal comparator to compare the current data value with the current comparison data value in a single clock cycle in a second clock cycle.

12. The apparatus of claim 1, wherein the memory testing circuit is configured to perform the test by performing the causing the first value to be sent to the memory circuit and the causing the internal comparator to compare the current data value with the current comparison data value in a single clock cycle.

13. The apparatus of claim 1, wherein the memory testing circuit is configured to perform the test in response to receiving one or more control signals that indicate that the memory circuit is configured to perform a comparison using the current data value.

14. The apparatus of claim 1, further comprising the memory circuit, wherein the internal comparator is configured to compare data values stored in a particular portion of the memory circuit with comparison data values, and wherein the memory circuit further comprises a second internal comparator configured to compare data values stored in a different portion of the memory circuit with different comparison data values.

15. A method comprising:
  receiving, from a self-test circuit, one or more testing signals that address a memory, wherein the one or more testing signals include a data value to be stored at the memory;
  identifying that the one or more testing signals indicate a comparison operation is to be performed at the memory;
  sending, to the memory, a write request that indicates the data value should be stored at the memory;
  sending, to the memory during a subsequent clock cycle, the data value as a comparison data value;
  sending, to the memory, a read request that addresses the data value stored at the memory;
  receiving, from the memory in response to the read request, an output value and a match value, wherein the match value indicates whether the data value matches the comparison data value; and
  indicating, to the self-test circuit, whether the match value indicated that the data value matched the comparison data value.

16. The method of claim 15, wherein indicating whether the match value indicated that the data value matched the comparison data value comprises, in response to the match value indicating that the data value did not match the comparison data value, modifying the output value.

17. The method of claim 15, further comprising sending one or more other memory requests to the memory subsequent to sending the write request and prior to sending the read request.

18. A non-transitory computer readable storage medium having stored thereon design information that specifies a circuit design in a format recognized by a fabrication system that is configured to use the design information to fabricate a hardware integrated circuit that includes circuitry configured to operate according to the circuit design, wherein the circuitry includes:
  a self-test circuit configured to test operation of a memory by requesting memory operations at the memory;
  a memory testing circuit configured to:
    receive, from the self-test circuit, one or more testing signals that indicate that a particular data value is being written to a particular location of the memory, wherein the one or more testing signals further indicate that a comparison operation involving the particular data value is to be performed at the memory upon reading the data value;
    send the particular data value to the memory in response to the one or more testing signals;
    during a subsequent clock cycle, send the particular data value to the memory as a comparison data value in response to a read request, from the self-test circuit, addressing the particular location;
    receive, from the memory, an output value and a match value, wherein the match value indicates whether the particular data value matches the comparison data value;
    in response to the match value indicating that the particular data value matches the comparison data value, send the output value to the self-test circuit; and
    in response to the match value indicating that the particular data value does not match the comparison data value:
      modify the output value to generate a modified output value, wherein the modified output value indicates a comparison failure; and
      send the modified output value to the self-test circuit.

19. The non-transitory computer readable storage medium of claim 18, wherein the output value is modified such that the self-test circuit will identify the modified output value as representing one or more read failures at the memory.

20. The non-transitory computer readable storage medium of claim 19, wherein the one or more read failures have a specified pattern indicative of the comparison failure.

* * * * *